INVENTOR
William M. Kaufman
BY [signature]
ATTORNEY

United States Patent Office 3,148,344
Patented Sept. 8, 1964

3,148,344

ADJUSTABLE RESISTANCE-CAPACITANCE BAND PASS FILTER USING INTEGRAL SEMICONDUCTOR HAVING TWO REVERSE BIASED JUNCTIONS

William M. Kaufman, Monroeville Boro, Pa., assignor to Westinghouse Electric Corporation, East Pittsburgh, Pa., a corporation of Pennsylvania Filed Mar. 24, 1961, Ser. No. 98,084
9 Claims. (Cl. 333—70)

The present invention relates to band pass filters, and more particularly to band pass filters in a monolithic or molecular block form having an adjustable band pass.

In many electronic circuit applications, an adjustable band pass filter is required, and especially so in the form of a monolithic or molecular block structure because of the size, weight and dependability advantages gained. The relative inadaptability of monolithic or molecular block structures to provide an inductive characteristic, makes it advantageous to utilize the distributed resistance-capacitance of a molecular structure, as this characteristic is more readily obtainable.

It is therefore an object of the present invention to provide a new and improved adjustable band pass filter in a monolithic form.

It is a further object of the present invention to provide a new and improved adjustable band pass filter utilizing the resistance-capacitance characteristics of a monolithic structure to be responsive to pass a predetermined band of frequencies.

The present invention, broadly, provides an adjustable band pass filter in a monolithic or molecular block structure which comprises a monolithic semiconductor structure including terminal means, regions of different types of semiconductivity and p-n junctions so biased as to have a distributed resistive-capacitive characteristic in which within the structure, one portion of the structure, including a back bias p-n junction, acts as a high frequency pass filter, and another portion of the monolithic structure, including another back biased p-n junction, acts as a low frequency pass filter; and with the filter portions being operative to allow the monolithic structure to be responsive to pass a band of frequencies substantially unattenuated.

Further objects and improvements will become apparent from the following description and drawings, in which.

Figure 1A:
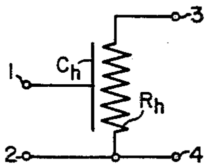
FIGURES 1A, 1B and 1C are schematic diagrams of a high frequency pass filter.
Figure 1B:
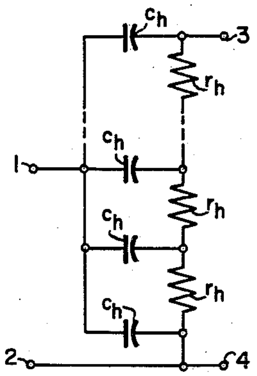
Figure 1C:
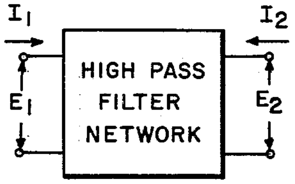

Referring now to FIGURE 1A in which is shown a distributed R–C high pass filter network having a total distributed resistance $R_h$ and a total distributed capacitance $C_h$, input terminals 1 and 2 and output terminals 3 and 4. Because the input is capacitive coupled, the filter network is more responsive to high frequencies than it is to low frequencies. The equivalent circuit of FIGURE 1A defines an infinite series of infinitesimal lumped parameters, which is shown schematically in FIGURE 1B. The incremental resistors and capacitors are shown as $r_h$ and $c_h$. The characteristics of the high pass filter network can be completely defined by writing its circuit equations. These equations written with reference to FIGURE 1C are:

$$E_1=Z_{11}(p)I_1+Z_{12}(p)I_2 \quad (1)$$

$$E_2=Z_{21}(p)I_1+Z_{22}(p)I_2 \quad (2)$$

The symbol $p$ is defined as the differential operator $d/dt$ so that $Z(p)$ parameters are merely shorthand methods for writing the differential or difference equations which relate the terminal voltages and currents. Substitution of $jw$ for $p$ gives the steady state response of the network, where $j$ is defined as $\sqrt{-1}$, and $w$ is the angular frequency.

The $Z(p)$ paramaters of the network of FIGURE 1A are given as:

$$Z_{11}=\frac{R_h}{\sqrt{R_hC_hp}}\coth\sqrt{R_hC_hp} \quad (3)$$

$$Z_{22}=\frac{2R_h}{\sqrt{R_hC_hp}}\tanh\sqrt{\frac{R_hC_hp}{2}} \quad (4)$$

$$Z_{12}=Z_{21}=\frac{R_h}{\sqrt{R_hC_hp}}\tanh\sqrt{\frac{R_hC_hp}{2}} \quad (5)$$

Figure 2A:
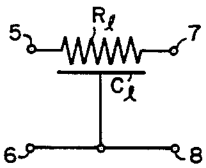
FIGS. 2A, 2B and 2C are schematic diagrams of a low frequency pass filter.
Figure 2B:
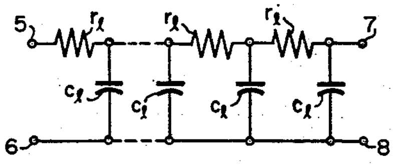
Figure 2C:
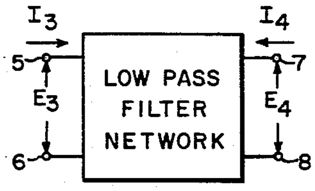

FIGURE 2A shows a distributed R–C low pass filter network having a total distributed resistance $R_1$ and a total distributed capacitance $C_1$, input terminals 5 and 6 and output terminals 7 and 8. A schematic circuit of the filter of FIGURE 2A is shown in FIGURE 2B as having an infinite series of incremental resistors $r_1$ and incremental capacitors $c_1$. The low pass filter characteristics can be defined by writing the circuit equations for the filter with reference to FIGURE 2C. These equations are:

$$E_3=I_3z_{11}(p)+I_4z_{12} \quad (6)$$

$$E_4=I_3z_{21}(p)+I_4z_{22}(p) \quad (7)$$

The impedances defined in terms of FIGURE 2A are:

$$z_{11}=z_{22}=\frac{R\coth\sqrt{R_1C_1p}}{\sqrt{R_1C_1p}} \quad (8)$$

$$z_{12}=z_{21}=\frac{R\operatorname{csch}\sqrt{R_1C_1p}}{\sqrt{R_1C_1p}} \quad (9)$$

Figure 3A:
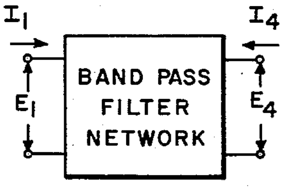
FIGS. 3A and 3B are schematic diagrams of a band pass filter.
Figure 3B:
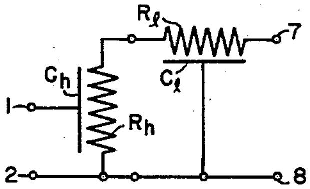

To provide a band pass, terminals 3 and 4 of FIGURE 1A are connected to terminals 5 and 6 of FIGURE 2A as is shown in FIGURE 3A. That this combination provides a band pass filter network can be shown by making $I_2=-I_3$, and $E_2=E_3$. Then solving the Equations 1, 2, 6 and 7 simultaneously for $I_3$ and then substituting $-I_3$ for $I_2$ into Equations 1 and 7 gives the following equations:

$$E_1=I_1\left[Z_{11}-\frac{Z_{21}Z_{12}}{Z_{22}+z_{11}}\right]+I_4\left[\frac{Z_{12}z_{12}}{Z_{22}+z_{11}}\right] \quad (10)$$

$$E_4=I_1\left[\frac{Z_{21}z_{21}}{Z_{22}+z_{11}}\right]+I_4\left[z_{22}\frac{z_{12}z_{21}}{Z_{12}+z_{11}}\right] \quad (11)$$

The no-load, voltage-voltage transfer function of this filter network in terms of the Z parameters is then given as $$\frac{E_4}{E_1}$$

with $I_4=0$, where:

$$\frac{E_4}{E_1}=\frac{\frac{Z_{21}z_{21}}{Z_{22}+z_{11}}}{Z_{11}-\frac{Z_{21}Z_{12}}{Z_{22}+z_{11}}} \quad (12)$$

Substituting into Equation 12 the functions for the Z parameters yields the following equation:

$$\frac{E_4}{E_1}=\frac{\cosh\sqrt{R_hC_hp}-1}{\sqrt{\frac{R_hC_l}{R_lC_h}}\sinh\sqrt{R_hC_hp}\sinh\sqrt{R_lC_lp}+\cosh\sqrt{R_hC_hp}\cosh\sqrt{R_lC_lp}} \quad (13)$$

Figure 4:
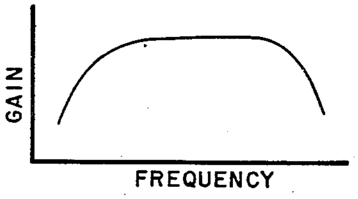
FIG. 4 is a plot of gain versus frequency for a band pass filter.

A plot of the magnitude of $$\frac{E_4}{E_1}$$

of Equation 13 for particular values of $R_h$, $C_h$, $R_l$ and $C_l$ is shown in FIGURE 4, which shows the response curve to be that of a band pass filter. For a more detailed analysis of the individual low pass and high-pass structures see "Distributed Parameter Networks for Circuit Miniaturization," C. K. Hager. AIEE-IRE-EIA-WCEMA Joint Electronic Components Conference, Philadelphia, Pa., May 1959, pp. 195–203.

Figure 5:
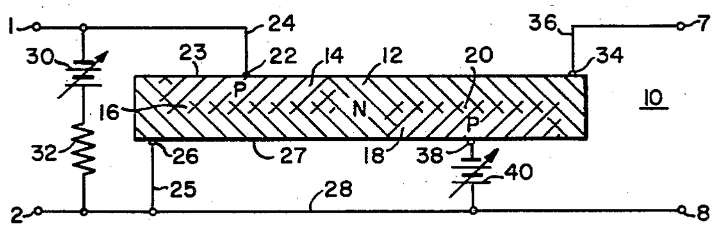
FIG. 5 is a side view of one embodiment of the filter of the present invention.

In FIGURE 5 is shown an adjustable band pass filter in monolithic or molecular block form. The semiconductive material employed may be silicon, germanium, silicon carbide or a stoichiometric compound comprised of elements from Group III of the Periodic Table, for example, gallium, aluminum and indium, and elements from Group V, for example, arsenic, phosphorus, and antimony. Examples of suitable III–V stoichiometric compounds include gallium arsenide, gallium antimonide, indium arsenide and indium antimonide. For purposes of clarity the filter will be discussed in terms of specific types of semiconductivity, however, it is to be understood that these types may be interchanged.

For example, to fabricate the present filter as shown in FIG. 5, a single crystal wafer 10 of semiconductor material, such as silicon, having n-type semiconductivity region 12, is diffused with a p-type acceptor doping material, such as aluminum, to form a p-type region 14, which forms a p-n junction 16 between n-type region 12 and p-type region 14. The p-type region 18 is also formed by diffusing an acceptor doping material, such as aluminum, into the n-type region 12. A p-n junction 20 is formed between n-type region 12 and p-type region 18. An ohmic contact 22 is fused to the surface 23 adjacent the p-type region 14 and is connected to terminal 1 through lead 24. An ohmic contact 26 is fused to the surface 27 of the n-type region 12 and connected through leads 28 and 25 to terminal 2. Between leads 24 and 25 is connected a battery 30, with its negative terminal toward lead 24, and a resistor 32. The battery 30 is to provide a reverse bias to the p-n junction 16. An ohmic contact 34 is fused to the surface 23 adjacent n-type region 12 and is connected to terminal 7 by the lead 36. An ohmic contact 38 is fused to the surface 27 adjacent the p-type region 18 and is connected to the negative terminal of battery 40. The positive terminal of the battery 40 is connected by the lead 28 to terminal 8. The battery 40 is used to control the reverse bias on the p-n junction 20.

To explain the operation of the filter of FIGURE 5, assume that a sinusoidal signal of a variable frequency is applied across the input terminals 1 and 2. At very low frequencies the capacitive reactance of the distributed capacitance $C_h$ at the reverse biased junction 16 is very large and very little voltage appears across the distributed resistance region between contacts 34 and 26. As the frequency of the signal applied across input terminals 1 and 2 is gradually raised, the capacitive reactance of $C_h$ gradually decreases and more current flows between contacts 22 and 26. Thus, as more current flows through the distributed resistive region an increasingly larger voltage appears between the contacts 34 and 26, and thus also between the output terminals 7 and 8. If the distributed capacitance $C_l$ of the reversed biased junction 20 is properly chosen, then over a range of frequencies in which substantially the entire input voltage appears across the distributed resistance region between contacts 34 and 26, the capacitive reactance $C_l$ of junction 20 is very large and negligibly small current flows across junction 20. Thus, there is a band of frequencies within which a substantial signal flows from input terminals 1 and 2 to output terminals 7 and 8. However, as the signal frequency is raised still further, the capacitive reactance of junction 20 continues to reduce and begins to allow considerable current to flow across junction 20 with less and less voltage drop across junction 20. Since, for alternating current considerations, terminal 38 is at ground potential, as the frequency increases the signal voltage across junction 20 approaches zero and the voltage between contacts 34 and 38 also approaches zero since contact 34 is located near junction 20 and the resistive region 12 offers very little transverse resistance between junction 20 and surface 23. Hence, a band-pass characteristic is displayed by the structure 10. As is well known in the art the capacitance of a reverse bias p-n junction is dependent upon the magnitude of the bias potential applied across it; therefore it can be seen that the band pass of the filter can be controlled by adjusting the values of the distributed capacitance $C_h$ and $C_l$.

Figure 6:
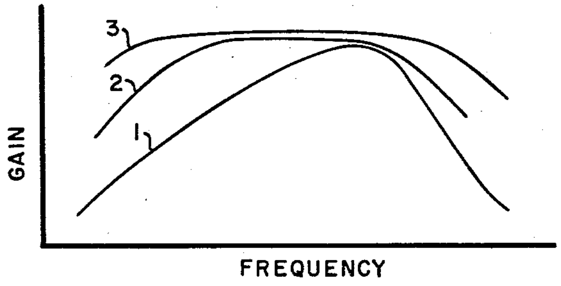
FIG. 6 is a plot of the gain versus frequency characteristics of an adjustable band pass filter.

In FIGURE 6 is shown a plot of the response characteristics of the filter for various values of $C_h$ and $C_l$. Curve 1 shows a relatively narrow band pass characteristic with $C_h$ equal to $C_l$. Curve 2, with $C_h$ equal to a hundred times the value of $C_l$, gives a substantially larger band pass. With $C_h$ equal to 10,000 times the value of $C_l$, the band pass as shown in curve 3 is again substantially larger than that of curve 2. So by adjusting the bias potentials across the respective p-n junctions the particular band pass characteristic can be obtained within a considerable range of frequencies.

Figure 7:
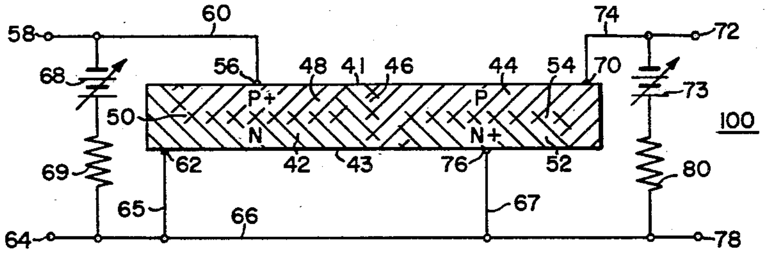
FIG. 7 is a side view of another embodiment of the filter of the present invention.

Referring to FIGURE 7 another embodiment of the present invention is shown. A single crystal wafer 100 of n-type material, which may for example be silicon, is masked from impurities over half its top 41 and bottom 43 surfaces. The n-type wafer is then diffused over the unmasked section with a p-type acceptor doping material, such as aluminum, to such an impurity concentration to make the region slightly p-type; this then provides a wafer with an n-type region 42 and a lightly doped p-type region 44, with a p-n junction 46 between these regions. The masking is then removed from the top 41 and bottom 43 surfaces of the wafer 100. The n-type region 42 is then diffused with a p-type acceptor doping material, such as aluminum, to a relatively high impurity concentration with respect to p-type region 44. To distinguish between a highly and a lightly doped p-type region, the symbols P+ and P will be used respectively. A P+ region 48 is so formed with a p-n junction 50 between region 48 and region 42. Into the P region 44 is diffused a donor impurity material, such as arsenic, to a relatively high impurity concentration relative to n-type region 42. The symbols N+ and N will be used to distinguish between highly and lightly doped regions, respectively. The N+ region 52 is so formed, and provides a p-n junction 54 between regions 44 and 52. An ohmic contact 56 is fused to the surface 41 adjacent P+ region 48 and connected to terminal 58 through lead 60. An ohmic contact 62 is fused to the surface 43 adjacent the N region 42 and connected to terminal 64 through leads 65 and 66. Between leads 60 and 66 is connected a battery 68, with its negative terminal toward lead 60, and a resistor 69. An ohmic contact 70 is fused to the surface 43 adjacent the P region 44 and connected to the terminal 72 through lead 74. An ohmic contact 76 is fused to the surface 43 adjacent the N+ region 52 and is connected through leads 66 and 67 to terminal 78. Between leads 74 and 66 is connected a battery 73 with its negative terminal toward lead 74, and a resistor 80. The batteries 68 and 73 are adjustable to control the reverse biases across the p-n junctions 50 and 54, respectively, and so control the value of the distributed capacitance provided therein.

Figure 8:
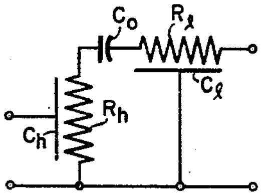
FIG. 8 is a schematic diagram of the filter of FIGURE 7.

The equivalent circuit for the filter of FIGURE 7 is shown in FIGURE 8; this circuit is the same as the equivalent circuit of the device of FIG. 5, except for the capacitor $C_0$ provided by the reverse biased p-n junction 46. The characteristics and operation of the filter of FIGURE 7 will be substantially identical to that of the filter of FIGURE 5 except that the capacitor $C_0$ will have the effect to sharpen the low frequency response if properly chosen. An advantage of the structure 100 of FIGURE 7 is that the bias potentials may be applied directly between the input and output terminals.

Figure 9:
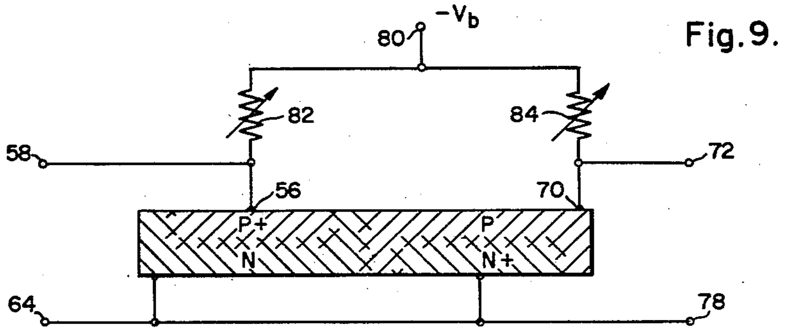
FIG. 9 is a schematic diagram of another embodiment of the filter of the present invention.

Another embodiment of the present invention is shown in FIGURE 9, which is substantially the same as FIGURE 7 except that only one potential source is required. The difference being a direct bias potential $-V_b$, not shown, is connected to terminal 80, which is connected to turn to the resistors 82 and 84. The resistors 82 and 84 are adjustable to provide the necessary control of the bias potentials across the p-n junctions 50 and 54. The resistors 82 and 84 will have high resistance on the order of the leakage resistances of junctions 50 and 54. The other end of the resistor 82 is connected to the ohmic contact 56 and also to the input terminal 58. The other end of the resistor 84 is connected to the ohmic contact 70 and also to the output terminal 72. This arrangement then provides a convenient embodiment requiring only one bias source to apply the necessary reverse bias potentials to the p-n junctions. The operation and fabrication of the filter of FIGURE 9 is substantially the same as that of the filter of FIGURE 7.

Although the present invention has been described with a certain degree of particularity, it should be understood that the present disclosure has only been made by way of example and that numerous changes in the details of fabrication and the combination and arrangement of elements may be resorted to without departing from the scope and spirit of the present invention.

I claim as my invention:

1. A monolithic semiconductor band pass filter device having one section in which attenuation increases with frequency and another section in which attenuation decreases with frequency, said attenuation characteristics being overlapped to form a band pass characteristic, each of said sections having distributed resistance and capacitance, said filter comprising a first rectifying p-n junction formed by two semiconductor regions of opposite type conductivity and adapted to constitute a first distributed capacitance, a second rectifying p-n junction formed by two semiconductor regions of opposite type conductivity and adapted to constitute a second distributed capacitance, one of said regions of each junction constituting a respective distributed resistance, said distributed resistance regions being integrally connected together, an ohmic contact on the outer end of each of said distributed resistance regions one of said contacts being an input terminal and the other of said contacts being an output terminal, an ohmic contact on the other region of said first p-n junction constituting the other input terminal and an ohmic contact on the other region of said second p-n junction constituting the other output terminal.

2. The combination as set forth in claim 1 and means including said terminals for reverse biasing said junctions.

3. The combination as set forth in claim 1 in which the semiconductor regions of each p-n junction are of the same conductivity type and both of the other semiconductor regions are of the opposite conductivity type.

4. The combination as set forth in claim 3 with means including said terminals for reverse biasing said p-n junctions for modifying the distributed capacitance of said junctions.

5. The combination as set forth in claim 1 in which the semiconductor resistance regions of each p-n junction are of different conductivity types.

6. A distributed R-C band pass filter having one section in which attenuation increases with frequency and another section in which attenuation decreases with frequency, said filter comprising an elongated monolithic semiconductor block, means in said monolithic block forming a main body of semiconductor material bridging the two sections of said filter, said body constituting a distributed resistance, a second semiconductor region of conductivity opposite to that portion of the main body with which it is contiguous to form a first p-n junction and adapted to constitute a distributed capacitance, a third semiconductor region contiguous with another portion of said main body and forming a second p-n junction and adapted to constitute a distributed capacitance, an ohmic contact on each of said second and third regions, respectively, two spaced contacts on said main body region at the opposite ends thereof, the contacts on said second region and the adjacent contact on said main body constituting input terminals and the contact on said third region C and adjacent contact on said main body constituting output terminals; and means, including said contacts for applying a reverse bias to said p-n junctions to modify the distributed capacitances thereof.

7. The combination as set forth in claim 6 in which both portions of said main body of semiconductor material is of the same conductivity type.

8. The combination as set forth in claim 6 in which said portions of said main body of semiconductor material are of different conductivity types.

9. A monolithic semiconductor band pass filter device having one portion in which attenuation increases with frequency and another portion in which attenuation decreases with frequency, said attenuation characteristics being overlapped to form an overall band pass characteristic, each of said portions having distributed resistance and capacitance, said filter comprising; a pair of input terminals and a pair of output terminals, a body of elongated semiconductor material constituting a distributed resistance, said body having two portions, a second region of semiconductor material contiguous with one portion of said body and being of conductivity type opposite to that of the portion of said body with which it is contiguous and forms a first p-n junction, a third semiconductor region contiguous with said second portion of said body and of a conductivity type opposite to that portion of said body with which it is contiguous and forms therewith a second p-n junction, said third region being longitudinally spaced from said second region, ohmic contacts on the outer faces of said second and third regions, and two ohmic contacts on said body spaced at the opposite ends of the latter and on sides thereof opposite said second and third regions, respectively, said contacts on said second region and the contact on said body adjacent said second region constituting said input terminals and the contact on said third region and the contact on the adjacent end of said body opposite said third region constituting the output terminals.

References Cited in the file of this patent

UNITED STATES PATENTS

| | | |
|---|---|---|
| 2,637,777 | Kilby | May 5, 1953 |
| 2,744,970 | Shockley | May 8, 1956 |
| 2,778,885 | Shockley | Jan. 22, 1957 |
| 2,844,795 | Herring | July 22, 1958 |
| 2,944,165 | Stuetzer | July 5, 1960 |
| 3,022,472 | Tanenbaum et al. | Feb. 20, 1962 |
| 3,060,327 | Dacey | Oct. 23, 1962 |

OTHER REFERENCES

Kaufman: Proc. I.R.E., September 1960, page 1540.

Hoger: Electronics, vol. 32, Microcircuits #36, pages 44–49, Sept. 4, 1959.

Herwald et al.: Integration of Circuits Functions Service, vol. 132, Semi-Conductor, October 21, 1960, pages 1127–1133 relied upon.